(12) United States Patent
Thacker et al.

(10) Patent No.: US 8,742,576 B2
(45) Date of Patent: Jun. 3, 2014

(54) MAINTAINING ALIGNMENT IN A MULTI-CHIP MODULE USING A COMPRESSIBLE STRUCTURE

(75) Inventors: Hiren D. Thacker, San Diego, CA (US); Hyung Suk Yang, Atlanta, GA (US); Ivan Shubin, San Diego, CA (US); John E. Cunningham, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 8 days.

(21) Appl. No.: 13/397,593

(22) Filed: Feb. 15, 2012

(65) Prior Publication Data
US 2013/0207261 A1   Aug. 15, 2013

(51) Int. Cl.
*H01L 23/48* (2006.01)
*H01L 23/498* (2006.01)
*H01L 21/50* (2006.01)

(52) U.S. Cl.
USPC ............ 257/738; 257/E23.069; 257/E23.023; 257/E21.499; 257/777; 257/723; 257/686; 257/685; 257/778; 257/737; 257/734; 257/774; 257/773; 257/779; 257/780; 361/767; 361/769; 361/790; 361/735; 361/803; 174/368; 174/250; 438/107; 438/66

(58) Field of Classification Search
USPC ......... 257/777, 723, 686, 685, 778, 737, 738, 257/734, 773, 774, 780, E23.069, E23.123, 257/E21.499, 779; 361/767, 769, 790, 803, 361/735; 174/52.1, 250, 368; 438/66, 107
See application file for complete search history.

(56) References Cited

U.S. PATENT DOCUMENTS

| | | | |
|---|---|---|---|
| 7,525,199 B1 | 4/2009 | Lauterbach | |
| 8,188,581 B2 * | 5/2012 | Shi et al. | 257/673 |
| 8,218,334 B2 * | 7/2012 | Chow et al. | 361/790 |
| 2009/0085183 A1 * | 4/2009 | Mitchell et al. | 257/686 |
| 2010/0327424 A1 | 12/2010 | Braunisch | |
| 2010/0327466 A1 * | 12/2010 | Drost et al. | 257/785 |
| 2011/0068479 A1 | 3/2011 | Shi | |
| 2011/0075380 A1 * | 3/2011 | Shi et al. | 361/740 |
| 2011/0147907 A1 | 6/2011 | Krishnamoorthy | |
| 2011/0223778 A1 * | 9/2011 | Chow et al. | 439/66 |
| 2011/0233789 A1 * | 9/2011 | Drost et al. | 257/777 |
| 2011/0278718 A1 * | 11/2011 | Thacker et al. | 257/737 |

OTHER PUBLICATIONS

Krishnamoorthy, Ashok V., "Computer Systems Based on Silicon Photonic Interconnects", Proceedings of the IEEE, vol. 97, No. 7, Jul. 2009.

(Continued)

*Primary Examiner* — Alexander Oscar Williams
(74) *Attorney, Agent, or Firm* — Park, Vaughan, Fleming & Dowler LLP; Steven E. Stupp (57) ABSTRACT

An MCM includes a two-dimensional array of facing chips, including island chips and bridge chips that communicate with each other using overlapping connectors. In order to maintain the relative vertical spacing of these connectors, compressible structures are in cavities in a substrate, which house the bridge chips, provide a compressive force on back surfaces of the bridge chips. These compressible structures include a compliant material with shape and volume compression. In this way, the MCM may ensure that facing surfaces of the island chips and the bridge chips, as well as connectors on these surfaces, are approximately coplanar without bending the bridge chips.

20 Claims, 9 Drawing Sheets

(56) References Cited

OTHER PUBLICATIONS

Shubin, I, "A Novel MCM Package Enabling Proximity Communication I-O", 2011 Electronic Components and Technology Conference.

Sze, T. "Proximity Communication Flip-Chip Package with Micron Chip-to-chip Alignment Tolerances", 2009 Electronic Components and Technology Conference.

* cited by examiner

MAINTAINING ALIGNMENT IN A MULTI-CHIP MODULE USING A COMPRESSIBLE STRUCTURE

CROSS REFERENCE TO RELATED APPLICATIONS

This application is related to U.S. Pat. No. 8,218,334, entitled "Multi-Chip Module with Multi-Level Interposer," by Eugene M. Chow, John E. Cunningham, James G. Mitchell and Ivan Shubin, filed Mar. 9, 2010, the contents of which are herein incorporated by reference.

BACKGROUND

1. Field

The present disclosure generally relates to a multi-chip module (MCM) which accommodates semiconductor chips. More specifically, the present disclosure relates to an MCM that includes a compressible structure that maintains alignment between components in the MCM.

2. Related Art

As integrated-circuit (IC) technology continues to scale to smaller critical dimensions, it is increasingly difficult for existing interconnection technologies to provide suitable communication characteristics, such as: high bandwidth, low power, reliability and low cost. Engineers and researchers are investigating chip stacking in multi-chip modules (MCMs) to address these problems, and to enable future high-density, high-performance systems.

However, because MCMs include multiple chips, it is all the more important to solve the so-called 'known-good die' problem. In particular, manufacturing yields can be improved (and cost can be reduced) by ensuring that only good semiconductor dies or chips are included in an MCM. This can be achieved by increasing the amount of testing at the die level. Because of cost and test-time limitations, this additional testing typically needs to be performed at the speed of the ICs at the wafer-level, which can be technically challenging. Alternatively, the manufacturing yield can be improved if the MCM is assembled in a remateable fashion, so that bad chips can be swapped out with good ones either during assembly and final testing, or even in the field.

Furthermore, it is often difficult to position and maintain the alignment of remateable components in MCMs. This is a problem because the degrees of freedom that allow the components to be remateable often result in misalignment between components, which can degrade inter-component communication in an MCM.

Hence, what is needed is an MCM that does not suffer from the above-described problems.

SUMMARY

One embodiment of the present disclosure provides a multi-chip module (MCM) that includes: a substrate, an island chip, a bridge chip and a compressible structure. The substrate has a first surface and a cavity defined by an edge in the first surface, where a bottom of the cavity is vertically offset from the first surface. Moreover, the island chip has a second surface that is mechanically coupled to the first surface, and the bridge chip has a third surface that faces the second surface, where the bridge chip is positioned in the cavity and is mechanically coupled to the island chip. Furthermore, the compressible structure is positioned between the bottom of the cavity and a fourth surface of the bridge chip which is on an opposite side of the bridge chip from the third surface. This compressible structure includes a compliant material with shape and volume compression, and the compressible structure provides a force on the bridge chip so that the second surface and the third surface are approximately coplanar without bending the bridge chip.

Note that the bridge chip may be electrically coupled to the island chip by proximity-communication connectors. For example, the proximity-communication connectors may include: capacitive proximity-communication connectors, inductive proximity-communication connectors, conductive proximity-communication connectors, and/or optical proximity-communication connectors. In some embodiments, the proximity-communication connectors include micro-spring connectors.

Additionally, the island chip may be electrically coupled to the first surface by solder.

In some embodiments, the bridge chip is mechanically coupled to the island chip by pairs of negative features on the second surface and the third surface and positive features that mate with the corresponding pairs of negative features. For example, the negative features may include pits and the positive features may include spherical balls. Alternatively or additionally, the pairs of negative features may be proximate to corners of the bridge chip and the island chip.

Furthermore, the compressible structure may include: a cylindrically shaped feature, an elliptically shaped bump, and/or a follicle-shaped feature. More generally, the compressible structure may be other than a spring. In some embodiments, the compliant material includes an elastomer.

Another embodiment provides a system that includes the MCM. This system may include a processor and a memory.

Another embodiment provides an electronic device that includes the MCM.

Another embodiment provides a method for maintaining alignment of an island chip and a bridge chip in the MCM. During this method, the compressible structure is positioned in the cavity, defined by the edge, in the first surface of the substrate in the MCM, where the compressible structure includes the compliant material with shape and volume compression, and where the bottom of the cavity is vertically offset from the first surface. Then, the bridge chip, which has a third surface and a fourth surface on the opposite side of the bridge chip from the third surface, is positioned in the cavity on top of the compressible structure, where the fourth surface is mechanically coupled to the compressible structure. Moreover, the island chip, having the second surface, is mechanically coupled to the first surface and the third surface, where the compressible structure provides the force on the bridge chip so that the second surface and the third surface are approximately coplanar without bending the bridge chip.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a multi-chip module (MCM), an electronic device or a system that includes the MCM, and a technique for maintaining alignment of an island chip and a bridge chip in the MCM are described. This MCM includes a two-dimensional array of facing chips, including island chips and bridge chips that communicate with each other using overlapping connectors. In order to maintain the relative vertical spacing of these connectors, compressible structures are in cavities in a substrate, which house the bridge chips, provide a compressive force on back surfaces of the bridge chips. These compressible structures include a compliant material with shape and volume compression. In this way, the MCM may ensure that facing surfaces of the island chips and the bridge chips, as well as connectors on these surfaces, are approximately coplanar without bending the bridge chips.

This assembly technique may increase the yield and manufacturing throughput of the MCM. For example, in conjunction with passive alignment (such as ball-and-pit structures) and/or remateable input/output (I/O) interconnects (such as micro-spring connectors), the MCM may facilitate simultaneous alignment and assembly of multiple chips (such as the bridge chips and the island chips) in the MCM. Consequently, the MCM may facilitate lower-cost integration of multiple chips in the MCM, with commensurate improvements in performance.

Figure 1:
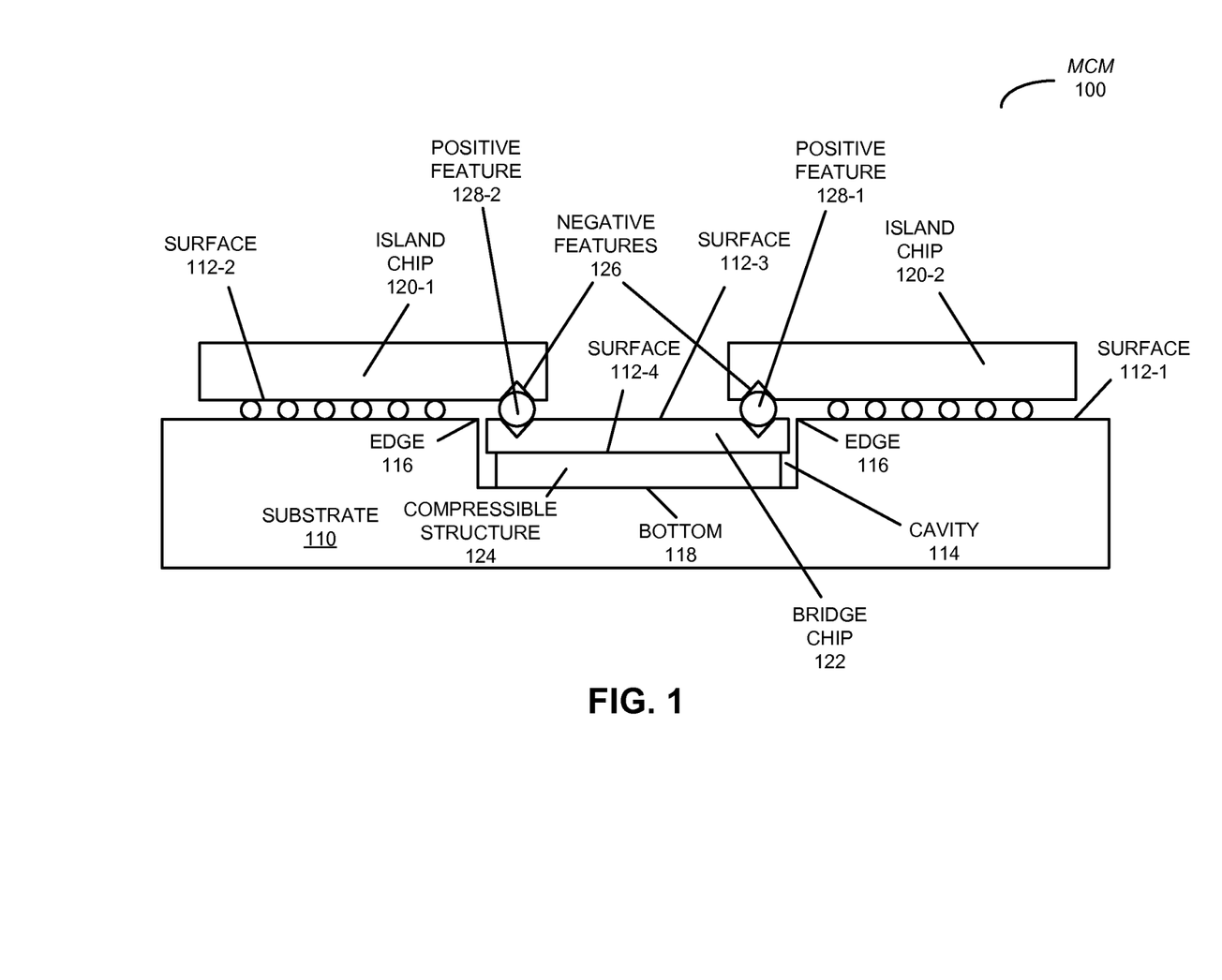
FIG. 1 is a block diagram illustrating a side view of a multi-chip module (MCM) in accordance with an embodiment of the present disclosure.

We now describe the MCM. FIG. 1 presents a block diagram illustrating a side view of an MCM 100. This MCM includes a substrate 110, island chips 120, a bridge chip 122 and a compressible structure 124. Substrate 110 has a surface 112-1 and a cavity 114 defined by an edge 116 in surface 112-1, where a bottom 118 of cavity 114 is vertically offset from surface 112-1.

Figure 2:
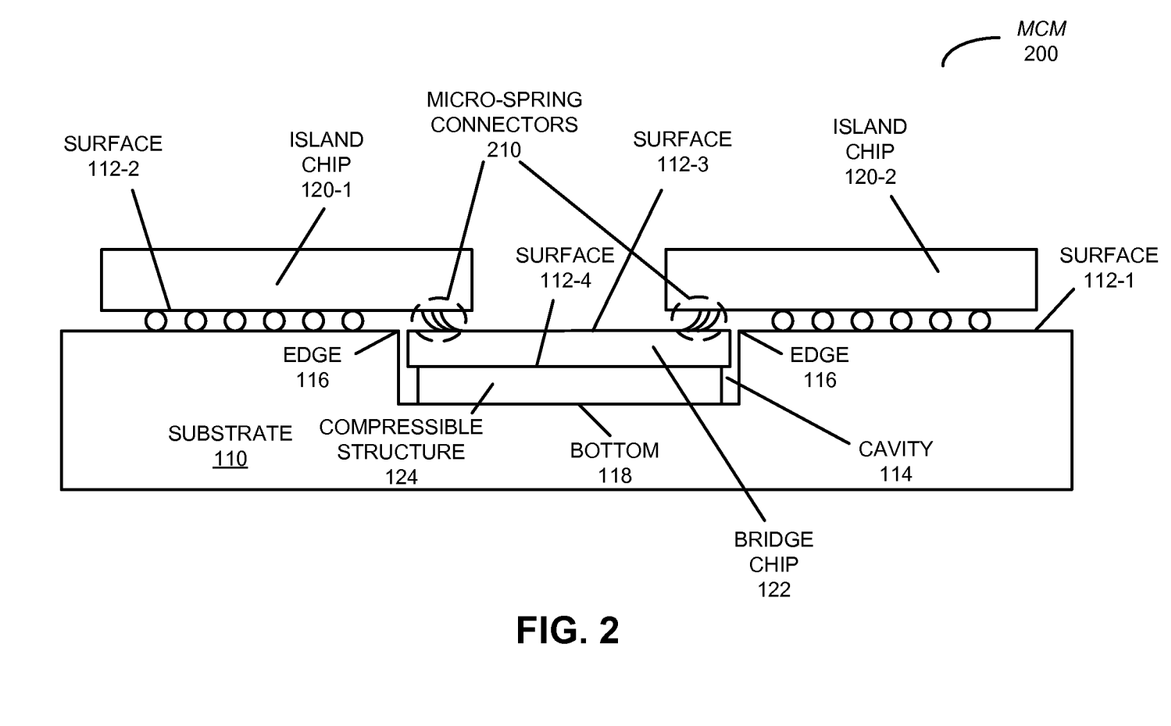
FIG. 2 is a block diagram illustrating a side view of an MCM in accordance with an embodiment of the present disclosure.

Moreover, island chip 120-1 has a surface 112-2 that is mechanically and/or electrically coupled to surface 112-1 (for example, by C4 solder), and bridge chip 122 has surfaces 112-3 and 112-4, where surface 112-3 faces and partially overlaps surface 112-2. Note that bridge chip 122 is positioned in cavity 114 and is mechanically and/or electrically coupled to island chips 120. For example, bridge chip 122 may be electrically coupled to island chips 120 by (at least partially) overlapping proximity-communication (P×C) connectors on surfaces 112-2 and 112-3, such as: capacitive P×C connectors, inductive P×C connectors, conductive P×C connectors, and/or optical P×C connectors. As shown in FIG. 2, which presents a block diagram illustrating a side view of an MCM 200, the P×C connectors may include compression-compliant micro-spring connectors 210. Note that, while bridge chip 122 communicates with island chips 120 using P×C, bridge chip 122 may be powered directly by island chips 120 or independently by substrate 110 (for example, using wire bonds).

Referring back to FIG. 1, when assembled in MCM 100, bridge chip 122 typically is pushed up against island chips 120 in order to minimize a gap between surfaces 112-2 and 112-3 (and, thus, between P×C connectors) and to make sure that 128-1 and 128-2 are engaged to provide lateral alignment. In MCM 100, this force may be provided by compressible structure 124, which is positioned between bottom 118 of cavity 114 and surface 112-4 of bridge chip 122. In particular, this compressible structure includes a compliant material with shape and volume compression. When partially compressed, compressible structure 124 provides a force on bridge chip 122 so that surfaces 112-2 and 112-3 are approximately coplanar without bending bridge chip 122 (e.g., without a vertical gap larger than 0.1-1 μm developing between island chips 120 and bridge chip 122), which may enable communication using the P×C connectors. Thus, compressible structure 124 may facilitate assembly and may help maintain (relative) alignment of components in MCM 100. For example, compressible structure 124 can absorb stress, such as that associated with different coefficients of thermal expansion and lateral shear force, thereby increasing the reliability of MCM 100 during operation. In addition, compressible structure 124 is also separate from substrate 110. This allows compressible structure 124 to 'slide' laterally as positive features 128 engage and align themselves.

MCM 100 may also include additional features that facilitate assembly and that may help maintain in-plane (XY) alignment of components. In particular, bridge chip 122 may be mechanically coupled to island chips 120 by pairs of negative features 126 on surfaces 112-2 and 112-3 and positive features 128 that mate with the corresponding pairs of negative features 126. For example, negative features 126 may include pits that are recessed below surfaces 112-2 and 112-3, and positive features 128 may include spherical balls that mate with negative features 126 (such as a ball-and-etch-pit structure), thereby aligning island chips 120 and bridge chip 122. (Alternatively or additionally, alignment in MCM 100 may be facilitated using positive features on surfaces 112-2 and 112-3, where these positive features protrude above these surfaces). In some embodiments, the pairs of negative features 126 are proximate to corners of bridge chip 122 and island chips 120.

As noted above, mating negative features 126 and positive features 128 can provide highly accurate self-alignment in the XY plane of island chips 120 and bridge chip 122, as well as coplanarity control during assembly. For example, the alignment over surfaces 112-2 and 112-3 may be within ±1 μm in the XY plane.

In some embodiments, components in MCM 100 are permanently attached after remateable alignment, for example, by using a post-alignment technique to permanently fix the chip-to-chip alignment. In particular, solder may be partially melted or reflowed at an elevated temperature to fuse components in MCM 100 to create a more permanent bond. However, in other embodiments, components in MCM 100 are remateably coupled, thereby facilitating rework of MCM 100.

In an exemplary embodiment, MCM 100 includes four positive features 128 per bridge chip. Moreover, compressible structure 124 may provide 1-2 pounds of compressive force per positive feature. Compressible structure 124 may have an uncompressed thickness of 100-200 μm and a compressed thickness of 50-60 μm when MCM 100 is assembled. Furthermore, cavity 114 may have a depth of 200-300 μm and bridge chip 122 may have a thickness of 150 μm. This reduced thickness of bridge chip 122 may reduce stiffness, but in conjunction with compressible structure 124, bridge chip 122 may remain 'flat' throughout assembly and operation of MCM 100. The compressible structure 124 may provide the necessary counter-forces in a uniform manner to a thinned bridge chip 122 preventing bowing of the bridge chip 122 or disrupting communication, such as P×C. For example, changes in the vertical gap or spacing between surfaces 112-2 and 112-3 may be less than 10% of the nominal gap.

As described further below with reference to FIGS. 3-7, a wide variety of features and shapes may be used to provide the force in compressible structure 124, including: a cylindrically shaped feature, an elliptically shaped bump, a hemispherically shaped bump, a truncated hemispherically shaped bump, a rectangularly shaped bump (such as a top hat), a pyramidally shaped bump, truncated pyramidally shaped bump and/or a follicle-shaped feature (for example, tilted finger-like structures). More generally, the compressible structure 124 may be other than a spring. In some embodiments, the compliant material in compressible structure 124 includes an elastomer.

Note that the compliant material may be fabricated using an additive fabrication process in which material is deposited or, more generally, added. However, in other embodiments a subtractive process, in which material is removed, is used either separately or in conjunction with the additive process. Furthermore, note that substrate 110 may include: a semiconductor (such as silicon or a silicon-on-insulator wafer), an organic material, a ceramic, glass, and/or a plastic.

During assembly of MCM 100, bridge chip 122 may be placed face-up in cavity 114 (on top of substrate 110). In addition, if there are negative features 126 on surface 112-3, positive features 128 may be placed in negative features 126. Then, a mechanical fixture may push down on bridge chip 122 while island chips 120 are aligned and attached to substrate 110, for example, using a reflow-attachment process. Once the reflow cycle is complete, the external mechanical load on bridge chip 122 is released, causing bridge chip 122 to be pushed away from substrate 110 by compressible structure 124. This upward force may cause the ball-in-pit structure to be engaged with a predetermined amount of force (against a reference mechanical plane provided by island chips 120) that was targeted in the design of MCM 100. Thus, using this assembly technique, island chips 120 can be attached to substrate 110, yet can still move freely to maintain (relative) alignment of connectors on surfaces 112-2 and 112-3 over the life of MCM 100.

A similar assembly technique may be used if bridge chip 122 includes micro-spring connectors 210 (FIG. 2) to provide remateable electrical connections between island chips 120 and bridge chip 122. However, in these embodiments the force applied by compressible structure 124 may be larger than the force applied by micro-spring connectors 210 (FIG. 2).

Figure 3:
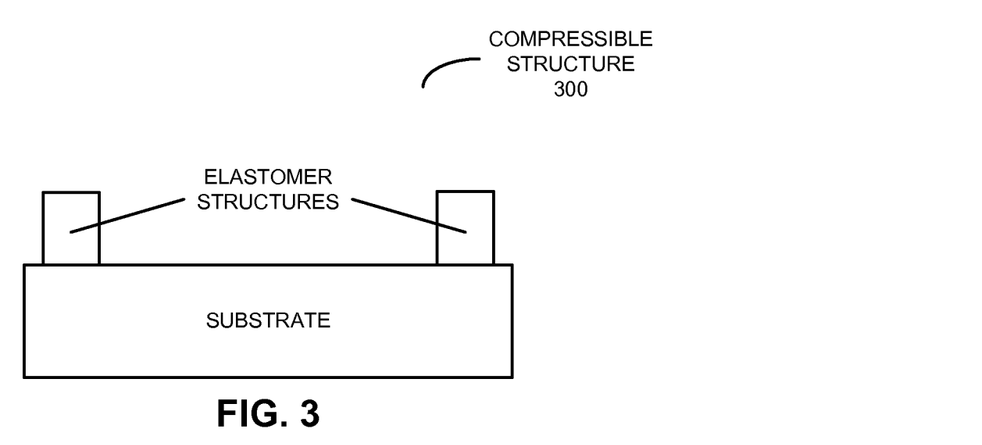
FIG. 3 is a block diagram illustrating a compressible structure in accordance with an embodiment of the present disclosure.
Figure 4:
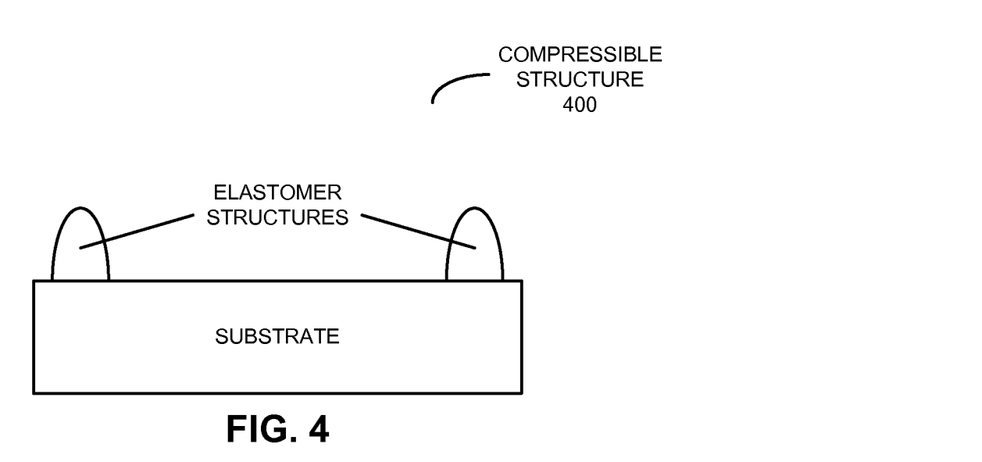
FIG. 4 is a block diagram illustrating a compressible structure in accordance with an embodiment of the present disclosure.

We now further describe the compressible structure. As shown in FIG. 3, which presents a block diagram illustrating a compressible structure 300, the compressible structure may include an array of elastomeric structures (and, more generally, a compliant material) fabricated on a thin substrate. The shapes and sizes of the individual elastomeric structures may be varied to fit the needs of the MCM. For example, as shown in FIG. 3, the elastomeric structures may be cylindrical (ranging from low to high aspect ratios). Alternatively, as shown in FIG. 4, which presents a block diagram illustrating a compressible structure 400, the elastomeric structures may be hemispherical domes.

The choice of material, shape, dimensions, placement, and number of elastomeric structures across substrate 110 (FIG. 1) may be varied to achieve the force-displacement characteristics required for the MCM. For example, a given compressible structure in the MCM may include single or multiple bumps at each desired location or may include an array of high-aspect ratio (hair-like) structures. These bumps may range in height from 50-500 μm and may be fabricated on a thin (50-200 μm) elastic substrate (such as tungsten foil, alumina, etc.). Note that the substrate in the compressible structure may be thin, and flat to facilitate fabrication and to fit into cavities (such as cavity 114 in FIG. 1) without significantly increasing the form factor. In addition, the substrate in the compressible structure may be stiff to reduce chip warpage or bending when the mechanical fixture is disengaged during the assembly technique.

We now describe techniques for fabricating the compliant material on a thin substrate in the compressible structure. In particular, large numbers of compressible structures may be fabricated from a reusable master mold using a stamping technique. By combining lithographic processes with the stamping technique, the fabricated compressible structures may be accurate at the micron scale and may be fabricated in batches (at the wafer or panel level), thereby significantly reducing the manufacturing cost.

In some embodiments, the fabrication technique includes two principal operations: fabrication of the reusable molds; and fabrication of the compressible structures by stamping/molding. During fabrication of the reusable molds, the shape of the compliant material (such as the elastomeric bumps) may be determined (because the shapes created in the molds will be replicated onto the compliant material). As noted previously, bumps with different mechanical characteristics (and, thus, different shapes and sizes) may be used depending on the MCM configuration. In addition, the number of bumps may be varied depending on the configuration.

Figure 5:
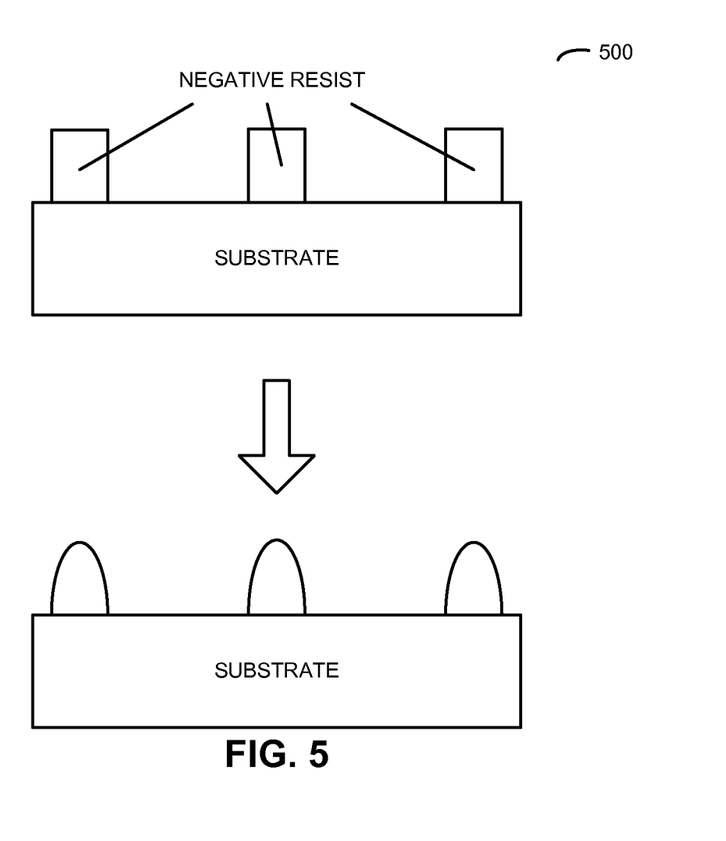
FIG. 5 is a flow diagram illustrating fabrication of a mold for a compressible structure in accordance with an embodiment of the present disclosure.

One technique for fabricating a mold is shown in FIG. 5, which presents a flow diagram 500 illustrating fabrication of a mold for a compressible structure. In this example, a negative photoresist (for example, a 100 μm thick film of NR21) is spun onto a substrate (such as silicon), and is patterned using photolithography to yield positive photoresist features at the locations of the bumps. (However, in other embodiments a positive photoresist may also be used.) Then, the photoresist features are reflowed using a thermal profile and transformed into hemispherical domes (such as domes having a diameter of 180 μm) with adequate adhesion to the substrate.

Figure 6:
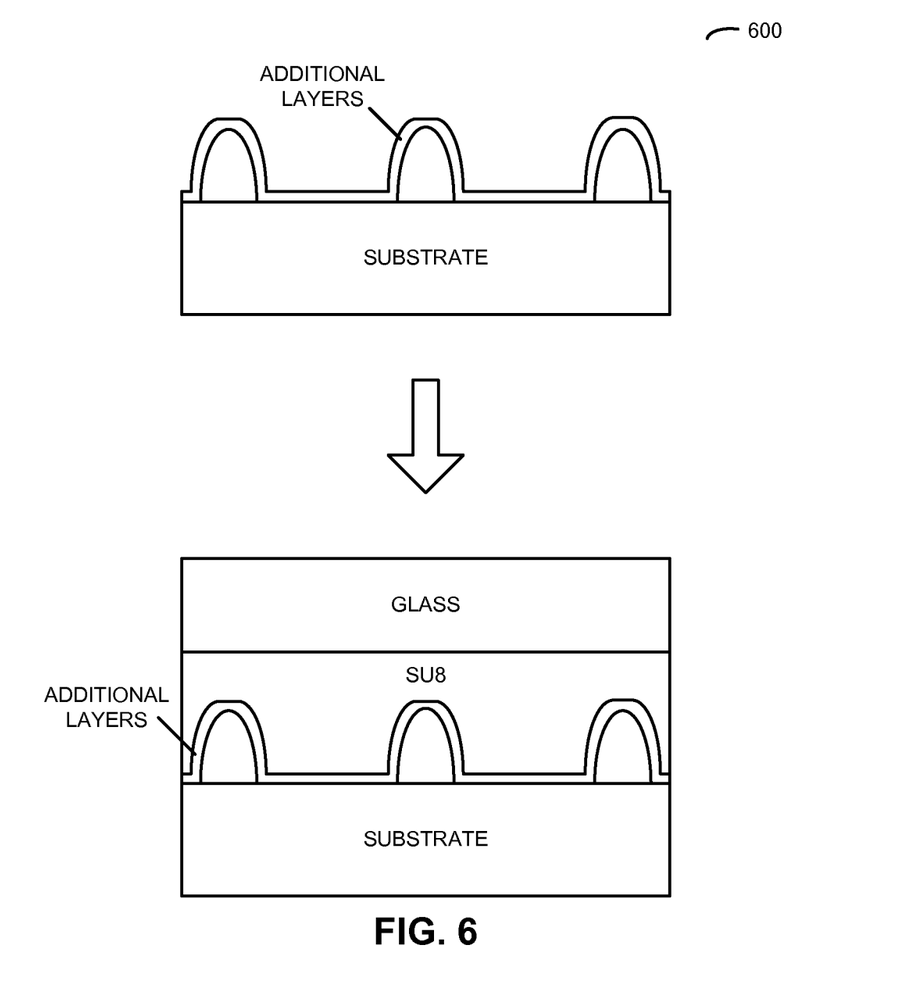
FIG. 6 is a flow diagram illustrating fabrication of a mold for a compressible structure in accordance with an embodiment of the present disclosure.

These positive features may be used to create the reusable negative mold. This is shown in FIG. 6, which presents a flow diagram 600 illustrating fabrication of a mold for a compressible structure. In particular, a sacrificial layer process may be used to build the mold from the positive reflowed features shown in FIG. 5. A titanium layer (which may have a thickness of 30 nm) and a gold layer (which may have a thickness of 300 nm) may be conformally deposited on the reflowed features. Then, a negative-resist layer (which may have a thickness of 2 μm) and another set of titanium and gold layers may be deposited. As described further below, note that the negative-resist layer may make it easier to separate the components after the mold has been fabricated.

Once the sacrificial layer and two instances of the metal layers are deposited, a photoresist, such as SU8, may be poured over the positive dome structure and a glass substrate may be placed over the SU8. Then, the SU8 may be crosslinked by exposing it in UV light through the glass slide and placing the structure in an oven at 90 C for a post-exposure bake. Note that the glass substrate is not a part of the final mold. Instead, the glass substrate may act as a carrier for the SU8 mold. However, one of a variety of UV-transparent substrates can be used. In principle, this fabrication process may be performed on a large glass panel so that multiple molds can be fabricated in parallel. These molds may correspond to different designs.

Once the SU8 layer has been fully crosslinked, the mold can be separated by placing it on a 150 C hot plate for few seconds. This may soften the negative-resist (sacrificial) layer and may make it easier to separate the mold from the positive features. Without this sacrificial-layer operation, the yield may be significantly reduced because the positive features may adhere to the mold. Once separated, the negative resist can also be cleaned and removed on both surfaces using appropriate solvents.

Figure 7:
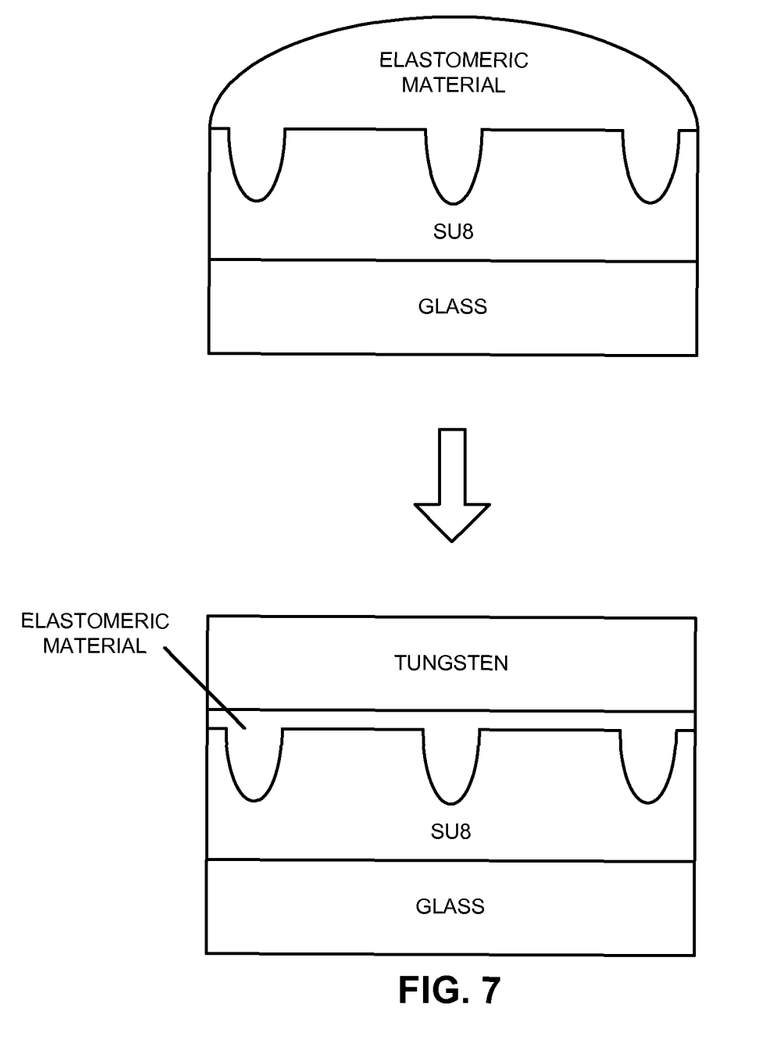
FIG. 7 is a flow diagram illustrating fabrication of a compressible structure in accordance with an embodiment of the present disclosure.

As shown in FIG. 7, which presents a flow diagram 700 illustrating fabrication of a compressible structure, once the mold is created an elastomeric material (and, more generally, the compliant material), such as silicone or Sylgard® 160 (from Dow Corning Corporation, of Midland, Mich.), may be poured over the mold and a thin substrate (for example, tungsten plate with a thin $SiO_2$ layer) in the compressible structure is placed on top. Then, a vertical force is exerted on the back of the compressible-structure substrate. This force may determine the thickness of the elastomer. The magnitude of the force should be high enough to yield a very thin base layer of elastomer. Next, the sample may be placed in a vacuum chamber to degas the compliant material, and then in an oven to cure and harden. Once the compliant material has cured and cooled to room temperature, it can be separated from the SU8 mold because SU8 and silicone typically have poor adhesion strength, while the silicone and the $SiO_2$ film on the Tungsten substrate usually have an excellent adhesion strength. Note that the $SiO_2$ film may play an important function in this regard, because adhesion of silicone to tungsten is usually not very good. As noted previously, after the components are separated, the negative resist can be cleaned and removed on both surfaces using one or more solvents. In an exemplary embodiment, the compressible structure includes 200 μm high silicone bumps fabricated on a 100 μm thick tungsten foil.

Thus, using the fabrication technique, a large array of compressible structures may be fabricated simultaneously. After fabrication, the compressible structures may be diced to their final size using a wafer dicing technique. Moreover, the molds may be reused to fabricate additional compressible structures.

Figure 8:
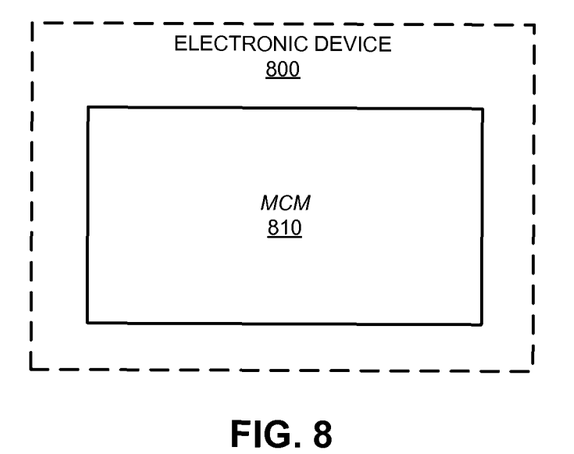
FIG. 8 is a block diagram illustrating an electronic device that includes an MCM in accordance with an embodiment of the present disclosure.

Embodiments of the MCM may be used in a wide variety of applications. A general application of an MCM is shown in FIG. 8, which presents a block diagram illustrating an electronic device 800. This electronic device includes MCM 810, which may be MCM 100 (FIG. 1) or 200 (FIG. 2).

Figure 9:
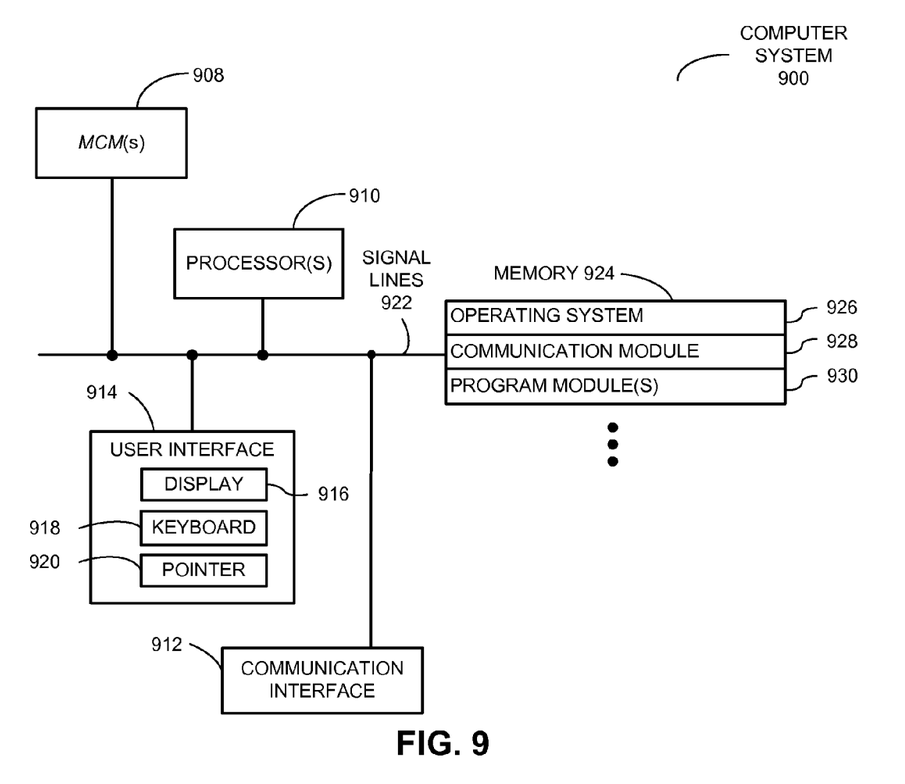
FIG. 9 is a block diagram illustrating a system that includes an MCM in accordance with an embodiment of the present disclosure.

FIG. 9 presents a block diagram illustrating a system 900 that includes one or more MCMs 908, such as MCM 100 (FIG. 1) or 200 (FIG. 2). System 900 may include: one or more processors 910, a communication interface 912 and a user interface 914, which may be coupled to other components in system 900 by one or more signal lines 922. Note that the one or more processors (or processor cores) 910 may support parallel processing and/or multi-threaded operation, the communication interface 912 may have a persistent communication connection, and the one or more signal lines 922 may constitute a communication bus. Moreover, the user interface 914 may include: a display 916, a keyboard 918, and/or a pointer 920, such as a mouse.

Memory 924 in system 900 may include volatile memory and/or non-volatile memory. More specifically, memory 924 may include: ROM, RAM, EPROM, EEPROM, flash, one or more smart cards, one or more magnetic disc storage devices, and/or one or more optical storage devices. Memory 924 may store an operating system 926 that includes procedures (or a set of instructions) for handling various basic system services for performing hardware-dependent tasks. Moreover, memory 924 may also store communications procedures (or a set of instructions) in a communication module 928. These communication procedures may be used for communicating with one or more computers, devices and/or servers, including computers, devices and/or servers that are remotely located with respect to the system 900.

Memory 924 may also include one or more program modules 930 (or a set of instructions). Note that one or more of program modules 930 may constitute a computer-program mechanism. Instructions in the various modules in the memory 924 may be implemented in: a high-level procedural language, an object-oriented programming language, and/or in an assembly or machine language. The programming language may be compiled or interpreted, i.e., configurable or configured, to be executed by the one or more processors (or processor cores) 910.

System 900 may include, but is not limited to: a server, a laptop computer, a communication device or system, a personal computer, a work station, a mainframe computer, a blade, an enterprise computer, a data center, a portable-computing device, a tablet computer, a cellular telephone, a supercomputer, a network-attached-storage (NAS) system, a storage-area-network (SAN) system, an electronic device, and/or another electronic computing device.

Note that embodiments of the one or more MCMs 908 may be used in a variety of applications, including: VLSI circuits, communication systems (such as in wavelength division multiplexing), storage area networks, data centers, networks (such as local area networks), and/or computer systems (such as multiple-core processor computer systems). For example, the one or more MCMs 908 may be included in a backplane that is coupled to multiple processor blades, or the one or more MCMs 908 may couple different types of components (such as processors, memory, input/output devices, and/or peripheral devices). Thus, the one or more MCMs 908 may perform the functions of: a switch, a hub, a bridge, and/or a router.

In general, system 900 may be at one location or may be distributed over multiple, geographically dispersed locations. Moreover, some or all of the functionality of system 900 may be implemented in one or more application-specific integrated circuits (ASICs) and/or one or more digital signal processors (DSPs). Furthermore, functionality in the preceding embodiments may be implemented more in hardware and less in software, or less in hardware and more in software, as is known in the art.

The preceding embodiments may include fewer components or additional components. For example, in FIG. 1 island chips 120 may be electrically coupled to substrate 110 using micro-spring connectors. In this case, an external clamping force may be applied to MCM 100 to hold the chips together. Moreover, although the MCM and system are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. Furthermore, features in two or more of the preceding embodiments may be combined with one another.

Note that surfaces on components (such as the substrate, the island chips and/or the bridge chip) should be understood to include surfaces of substrates or surfaces of layers deposited on these substrates (such as a dielectric layer deposited on a substrate). Additionally, note that components in the MCM may be fabricated, and the MCM may be assembled, using a wide variety of techniques, as is known to one of skill in the art.

Figure 10:
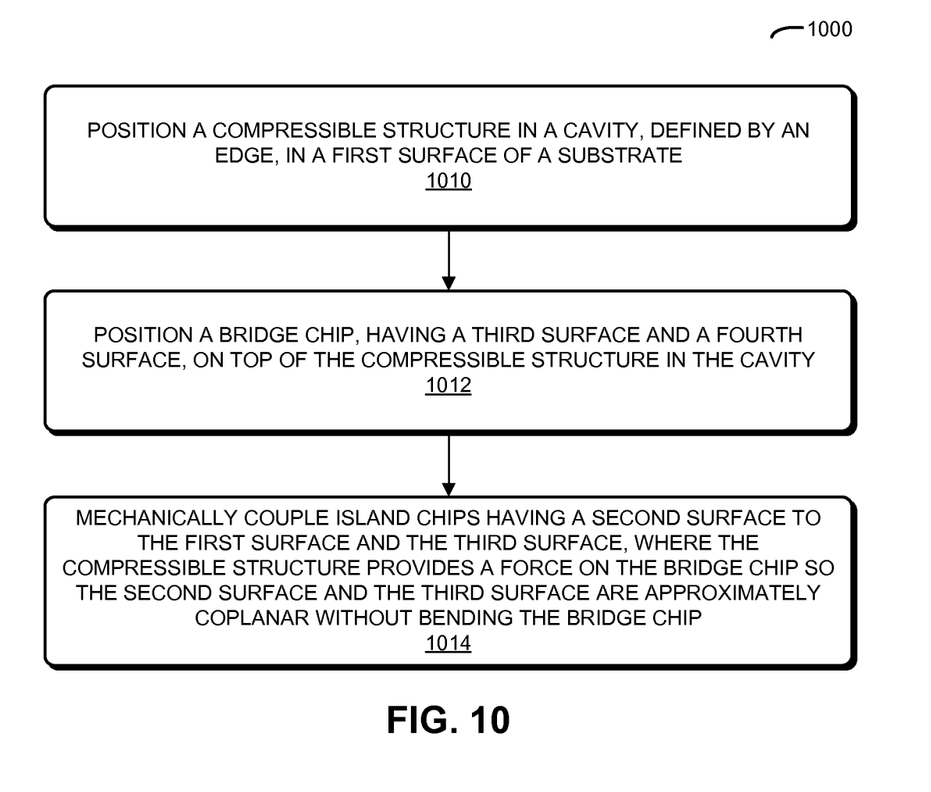
FIG. 10 is a flow diagram illustrating a method for maintaining alignment of an island chip and a bridge chip in an MCM in accordance with an embodiment of the present disclosure.

We now describe embodiments of the method. FIG. 10 presents a flow diagram 1000 illustrating a method for maintaining alignment of an island chip and a bridge chip in an MCM, such as MCM 100 (FIG. 1) or 200 (FIG. 2). During this method, a compressible structure is positioned in a cavity, defined by an edge, in a first surface of a substrate in the MCM (operation 1010), where the compressible structure includes a compliant material with shape and volume compression, and where a bottom of the cavity is vertically offset from the first surface. Then, a bridge chip, which has a third surface and a fourth surface (on an opposite side of the bridge chip from the third surface), is positioned in the cavity on top of the compressible structure (operation 1012), where the fourth surface is mechanically coupled to the compressible structure. Moreover, an island chip, having a second surface, is mechanically coupled to the first surface and the third surface (operation 1014), where the compressible structure provides a force on the bridge chip so that the second surface and the third surface are approximately coplanar without bending the bridge chip.

In some embodiments, method 1000 includes additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multi-chip module (MCM), comprising:
a substrate having a first surface and a cavity defined by an edge in the first surface, wherein a bottom of the cavity is vertically offset from the first surface;
an island chip having a second surface, wherein the island chip is mechanically coupled to the first surface;
a bridge chip having a third surface that faces the second surface, wherein the bridge chip is mechanically coupled to the island chip, and wherein the bridge chip is positioned in the cavity; and
a compressible structure positioned between the bottom of the cavity and a fourth surface of the bridge chip which is on an opposite side of the bridge chip from the third surface, wherein the compressible structure includes a compliant material with shape and volume compression, wherein the compressible structure is separate from the substrate, thereby allowing the compressible structure to slide laterally; and
wherein the compressible structure provides a force on the bridge chip so that the second surface and the third surface are approximately coplanar without bending the bridge chip.

2. The MCM of claim 1, wherein the bridge chip is electrically coupled to the island chip by proximity-communication connectors.

3. The MCM of claim 2, wherein the proximity-communication connectors include one of: capacitive proximity-communication connectors, inductive proximity-communication connectors, conductive proximity-communication connectors, and optical proximity-communication connectors.

4. The MCM of claim 2, wherein the proximity-communication connectors include micro-spring connectors.

5. The MCM of claim 1, wherein the island chip is electrically coupled to the first surface by solder.

6. The MCM of claim 1, wherein the bridge chip is mechanically coupled to the island chip by pairs of negative features on the second surface and the third surface and positive features that mate with corresponding pairs of negative features.

7. The MCM of claim 6, wherein the negative features include pits and the positive features includes spherical balls.

8. The MCM of claim 6, wherein the pairs of negative features are proximate to corners of the bridge chip and the island chip.

9. The MCM of claim 1, wherein the compressible structure includes one of: a cylindrically shaped feature, an elliptically shaped bump, and a follicle-shaped feature.

10. The MCM of claim 1, wherein the compressible structure is other than a spring.

11. The MCM of claim 1, wherein the compliant material includes an elastomer.

12. A system, comprising:
a processor;
a memory storing a program module that is configured to be executed by the processor; and
an MCM, wherein the MCM includes:
a substrate having a first surface and a cavity defined by an edge in the first surface, wherein a bottom of the cavity is vertically offset from the surface;
an island chip having a second surface, wherein the island chip is mechanically coupled to the first surface;
a bridge chip having a third surface that faces the second surface, wherein the bridge chip is mechanically coupled to the island chip, and wherein the bridge chip is positioned in the cavity; and
a compressible structure positioned between the bottom of the cavity and a fourth surface of the bridge chip which is on an opposite side of the bridge chip from the third surface, wherein the compressible structure includes a compliant material with shape and volume compression, wherein the compressible structure is separate from the substrate, thereby allowing the compressible structure to slide laterally; and
wherein the compressible structure provides a force on the bridge chip so that the second surface and the third surface are approximately coplanar without bending the bridge chip.

13. The system of claim 12, wherein the bridge chip is electrically coupled to the island chip by proximity-communication connectors.

14. The system of claim 13, wherein the proximity-communication connectors include one of: capacitive proximity-communication connectors, inductive proximity-communication connectors, conductive proximity-communication connectors, and optical proximity-communication connectors.

15. The system of claim 13, wherein the proximity-communication connectors include micro-spring connectors.

16. The system of claim 12, wherein the island chip is electrically coupled to the first surface by solder.

17. The system of claim 12, wherein the bridge chip is mechanically coupled to the island chip by pairs of negative features on the second surface and the third surface and positive features that mate with corresponding pairs of negative features.

18. The system of claim 12, wherein the compressible structure is other than a spring.

19. The system of claim 12, wherein the compliant material includes an elastomer.

20. A method for maintaining alignment of an island chip and a bridge chip in an MCM, the method comprising:
positioning a compressible structure in a cavity, defined by an edge, in a first surface of a substrate in the MCM, wherein the compressible structure includes a compliant material with shape and volume compression, and where a bottom of the cavity is vertically offset from the first surface, wherein the compressible structure is separate from the substrate, thereby allowing the compressible structure to slide laterally;
positioning a bridge chip, which has a third surface and a fourth surface on an opposite side of the bridge chip from the third surface, in the cavity on top of the compressible structure, wherein the fourth surface is mechanically coupled to the compressible structure; and
mechanically coupling an island chip, having a second surface, to the first surface and the third surface, wherein the compressible structure provides a force on the bridge chip so that the second surface and the third surface are approximately coplanar without bending the bridge chip.

\* \* \* \* \*